(12) United States Patent  (10) Patent No.: US 8,531,214 B2
Chen et al.  (45) Date of Patent: *Sep. 10, 2013

(54) SPREAD SPECTRUM CLOCK GENERATORS

(71) Applicant: MediaTek Inc., Hsin-Chu (TW)

(72) Inventors: Shang-Ping Chen, Tai-Chung (TW); Ping-Ying Wang, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/744,821

(22) Filed: Jan. 18, 2013

(65) Prior Publication Data

US 2013/0127501 A1 May 23, 2013

Related U.S. Application Data

(63) Continuation of application No. 11/940,486, filed on Nov. 15, 2007, now Pat. No. 8,379,787.

(51) Int. Cl.
*H03D 3/24* (2006.01)

(52) U.S. Cl.
USPC ........... 327/115; 327/157; 327/148; 327/147; 327/149; 375/376; 375/373; 375/371; 375/354; 375/130

(58) Field of Classification Search
USPC ................. 327/115, 157, 148, 147, 149, 150; 375/376, 373, 371, 354, 130
See application file for complete search history.

(56) References Cited

U.S. PATENT DOCUMENTS

| 7,173,462 | B1 | 2/2007 | Wang |
| 7,389,095 | B1 | 6/2008 | Liu et al. |
| 7,676,012 | B1 | 3/2010 | Venugopal et al. |
| 2003/0039330 | A1 | 2/2003 | Castiglione et al. |
| 2004/0136440 | A1 | 7/2004 | Miyata et al. |
| 2006/0056490 | A1 | 3/2006 | Chen et al. |
| 2006/0146971 | A1 | 7/2006 | Kaizuka |
| 2006/0290393 | A1 | 12/2006 | Yamamoto et al. |
| 2007/0019711 | A1 | 1/2007 | Mallinson et al. |
| 2007/0252737 | A1 | 11/2007 | Eikenbroek |
| 2008/0100365 | A1 | 5/2008 | Kaizuka |
| 2009/0072913 | A1 | 3/2009 | Eikenbroek |

FOREIGN PATENT DOCUMENTS

| EP | 1 612 946 | 1/2006 |
| WO | WO 2004/088846 | 10/2004 |
| WO | WO 2006/002844 | 1/2006 |

OTHER PUBLICATIONS

"All Digital Spread Spectrum Clock Generator for EMI Reduction;" Damphousse, et al., 2006.

*Primary Examiner* — Zewdu Kassa

(74) *Attorney, Agent, or Firm* — McClure, Qualey & Rodack, LLP

(57) ABSTRACT

Spread spectrum generators and methods are disclosed. In one implementation, a spread spectrum clock generator includes a phase locked loop generating an output clock according to a first clock and a second clock; a delay line coupled between the first clock and the phase locked loop; a modulation unit providing a modulation signal to control the delay line thereby modulating phase of the first clock, such that frequency of the output clock generated by the phase locked loop varies periodically; a scaling unit scaling the modulation signal from the modulation unit according to a scaling ratio, and outputting to the delay line; and a calibration unit generating an output signal for controlling the scaling ratio.

14 Claims, 7 Drawing Sheets

SPREAD SPECTRUM CLOCK GENERATORS

CROSS REFERENCE TO RELATED APPLICATIONS

This application is a Continuation of pending U.S. patent application Ser. No. 11/940,486, filed Nov. 15, 2007 and entitled "SPREAD SPECTRUM CLOCK GENERATORS," the entirety of which is incorporated herein by reference.

BACKGROUND OF THE INVENTION

1. Field of the Invention

The invention relates to a spread spectrum clock generator and a method for generating a spread spectrum clock signal.

2. Description of the Related Art

Conventional EMI (Electronic Magnetic Interference) prevention measures include EMI filters, ferrite beads, chokes, adding power layer and ground plane to board, metal shielding, special coatings, and RF gaskets. However, a principle source of EMI is system clocks, including frequency timing generators, crystal oscillators, voltage controlled oscillators (VCOs) and phase lock loops (PLLs). An efficient and economical method of reducing EMI for an entire system is to use low-EMI spread spectrum clock (SSC) oscillators. The advantages of using low EMI oscillators are compliance with regulatory testing, short time-to-market, and cost reduction.

BRIEF SUMMARY OF THE INVENTION

A detailed description is given in the following embodiments with reference to the accompanying drawings.

Spread spectrum clock generators are provided, in which a phase lock loop generates an output clock according to a first input clock and a second input clock, and a delay line is coupled between the first input clock and the phase lock loop. A modulation unit provides a modulation signal to control the delay line, thereby modulating phase of the first input clock, such that frequency of the output clock generated by the phase lock loop varies periodically.

In an embodiment of a spread spectrum clock generator, a phase lock loop generates an output clock according to a first input clock and a second input clock, a delay line is coupled between the first input clock and the phase lock loop, a modulation unit is coupled to the delay line, a scaling unit is coupled between the delay unit and the modulation unit, and a calibration unit is coupled to the scaling unit.

The invention also provides an embodiment of a method for generating spread spectrum clock signals, in which a modulation signal is provided and phase of a first input clock of a phase lock loop is modulated according to the modulation signal, such that frequency of an output clock generated by the phase lock loop varies periodically.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
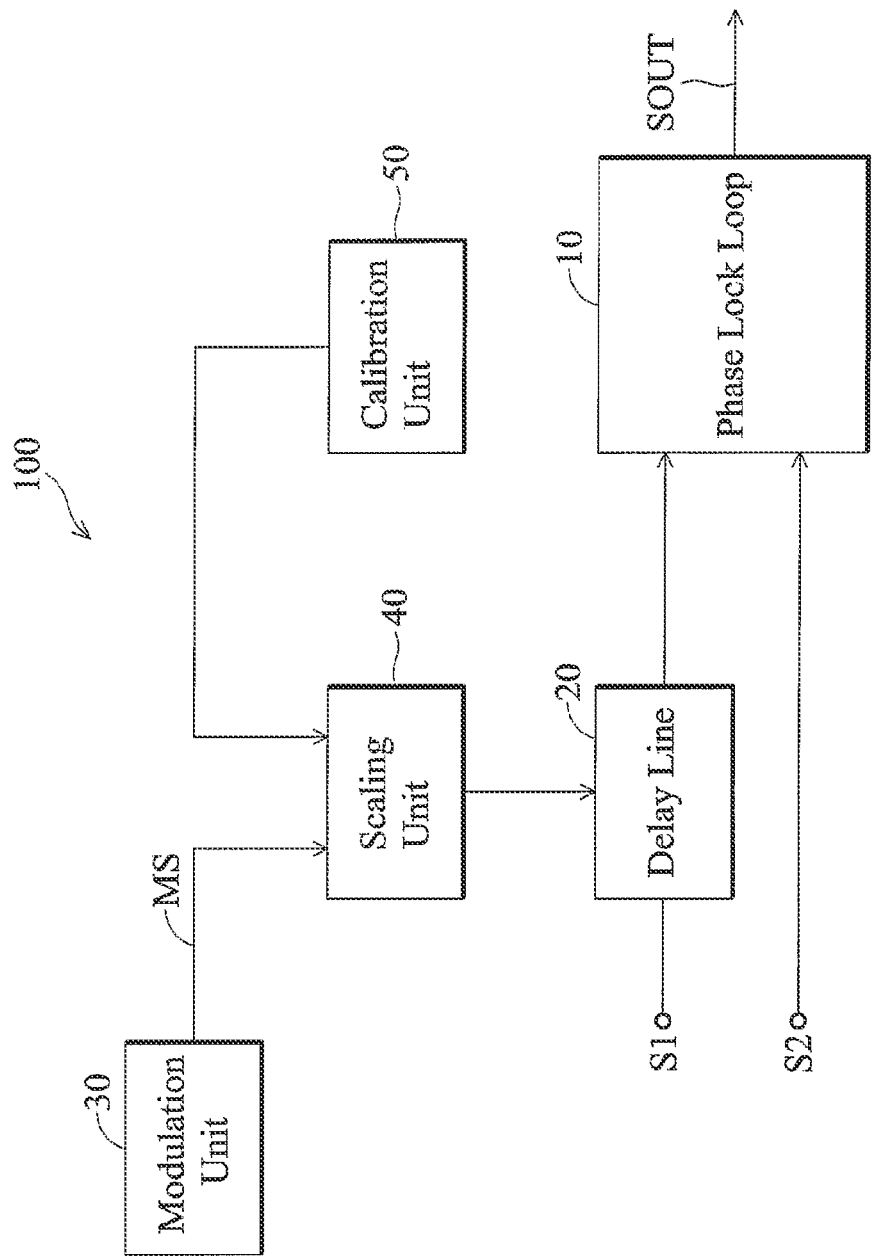
FIG. 1 shows an embodiment of a spread spectrum clock generator.

FIG. 1 shows an embodiment of a spread spectrum clock generator. As shown, the spread spectrum clock generator comprises a phase lock loop 10, a delay line 20, a modulation unit 30, a scaling unit 40, and a calibration unit 50.

The phase lock loop 10 generates an output clock SOUT according to a first input clock S1 and a second input clock S2. For example, the phase lock loop 10 can comprises a phase/frequency detector, a charge pump, a low-pass filter and a voltage controlled oscillator (VCO). The phase/frequency detector detects the phase shift between the first and second input clocks S1 and S2 and outputs a pump-up signal or a pump-down signal to control the charge pump. Voltage generated by the charge pump is filtered by the low-pass filter and supplied to the VCO as its reference voltage. Based on the reference voltage, the VCO generates a clock signal. The VCO may be any circuit that generates clock frequency signals in response to an input reference voltage. In general, a ring oscillator may be a typical VCO structure. Since the structure of the phase lock loop 10 is known in the art, detailed description thereof is omitted.

For example, the first input clock S1 can be provided by a crystal oscillator and the second input clock S2 can be provided by a frequency divider according to the output clock SOUT of the phase lock loop 10. Alternately, the first input clock S1 can be provided by a frequency divider according to the output clock of the phase lock loop 10 and the second input clock S2 can be provided by a crystal oscillator.

Since phase difference between the first and second input clocks S1 and S2 causes variation in frequency of the output clock SOUT, the relationship between the frequency of the output clock SOUT and the phase difference between the first and second input clocks S1 and S2 can be regarded as $$f = \frac{d\Phi}{dt}.$$

Hence, the invention generates a spread spectrum clock by modulating the phase of the first input clock S1. Namely, the modulation unit 30 provides a modulation signal MS to control the delay line 20 coupled between the first input clock S1 and the phase lock loop 10, thereby modulating phase of the first input clock S1, such that frequency of the output clock SOUT generated by the phase lock loop 10 varies periodically.

For example, the delay line 20 can be a digital delay line or an analog delay lock loop (DLL), but is not limited thereto. Further, a scaling unit 40 can be disposed between the delay line 20 and the modulation unit 30 to scale the modulation signal MS, with a calibration unit 50 adjusting a scale ratio of the scaling unit 40.

Figure 2A:
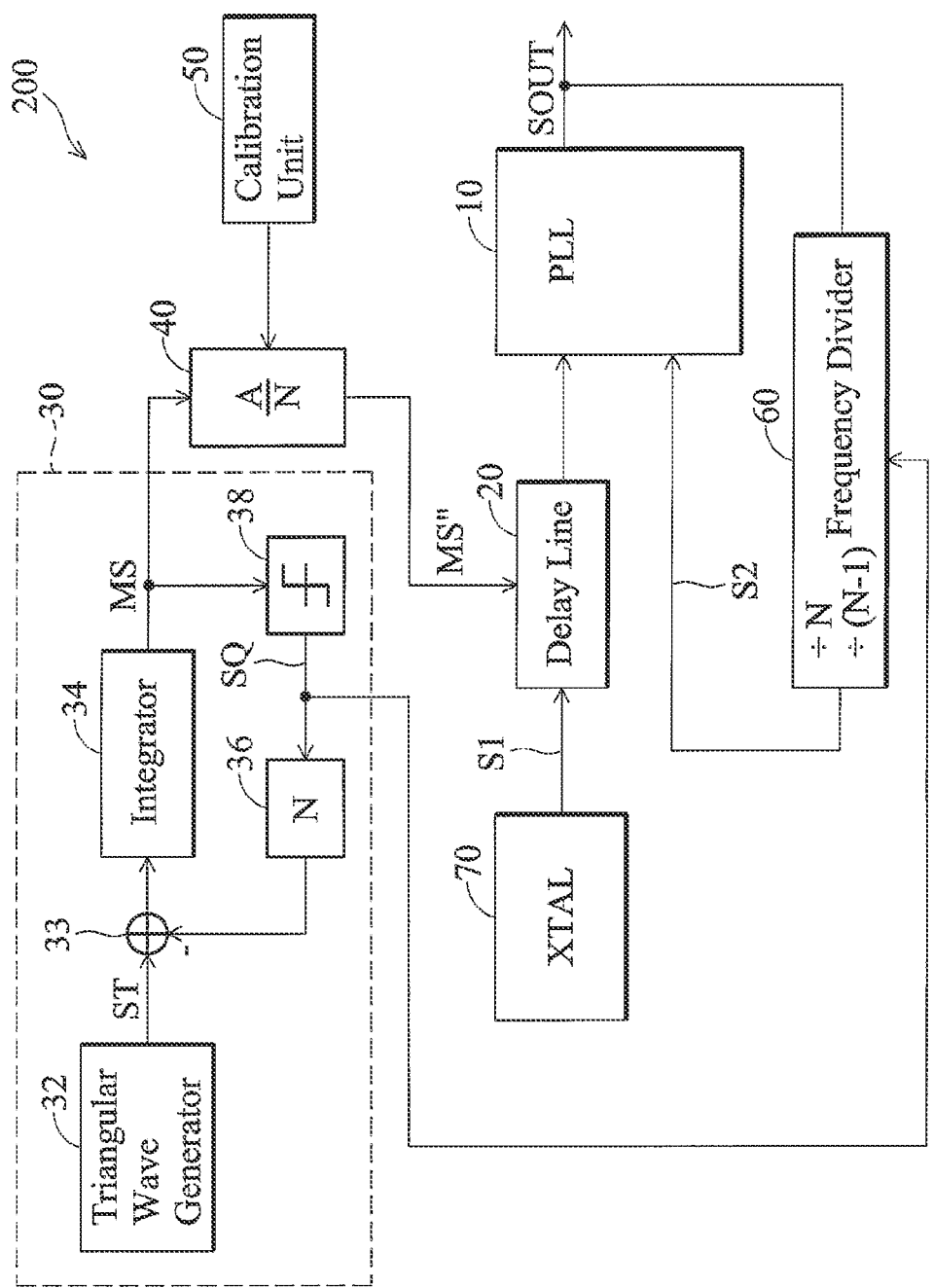
FIG. 2A shows another embodiment of a spread spectrum clock generator.

FIG. 2A shows another embodiment of a spread spectrum clock generator. As shown, the spread spectrum clock generator 200 differs from that in FIG. 1 only in the phase lock loop 10, the delay line 20, the scaling unit 40 and the calibration unit 50. In this embodiment, the first input clock S1 is provided by a crystal oscillator 70, and the second input clock S2 is provided by the frequency divider 60 in response to the output clock SOUT of the phase lock loop 10.

Figure 2B:
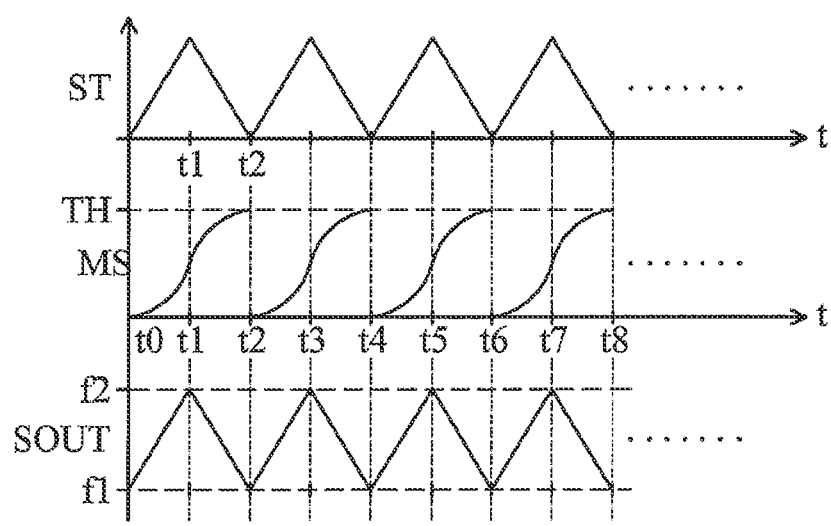
FIG. 2B shows an embodiment of a delay line.

The modulation unit 30 comprises a triangular wave generator 32, a subtractor 33, an integrator 34, a quantizer 38 and a scaling unit 36. The triangular wave generator 32 generates a triangular wave signal ST as shown in FIG. 2B output to the integrator 34 through subtractor 33. The triangular wave generator 32, can, for example, be an up-down counter but is not limited thereto. The quantizer 38 generates a value SQ of "0" or "1" according to the modulation signal MS (the integrated triangular wave signal). For example, when the modulation signal MS reaches a threshold value TH, the quantizer 38 generates a value SQ of "1", and when the modulation signal MS does not reach the threshold value TH, the quantizer 38 generates a value SQ of "0".

The scaling unit 36 scales the value SQ generated by the quantizer 38 for output to the subtractor 33. For example, when the quantizer 38 generates the value SQ of "1" because the modulation signal MS reaches threshold value TH, the scaling unit 36 scales the value SQ and outputs to the subtractor 33. Hence, the subtractor 33 subtracts the scaled value from the integration signal MS of the integrator 34, such that the integration signal MS is reset and becomes zero accordingly. As shown in FIG. 2B, the modulation signal MS is reset by the scaled value output from the scaling unit 36 at time t2, t4, t6 and t8 and so on. Further, when the modulation signal MS is reset (becomes zero), the quantizer 38 generates a value SQ of "0" until the modulation signal reaches the threshold value TH again. Hence, the triangular wave signal ST from the triangular wave generator 32 is integrated into the threshold value TH from zero repeatedly, as shown in FIG. 2B to serve as the modulation signal MS. The subtractor 33, the integrator 34, quantizer 38 and the scaling unit 36 are connected to form a feedback loop, such that the triangular wave signal ST is integrated as the modulation signal MS as shown in FIG. 2B.

The modulation signal MS output from the integrator 34 is then scaled by the scaling unit 40 and output to the delay line 20. The delay line 20 modulates the phase of the first input clock S1 according to the scaled modulation signal MS", such that frequency of the output clock SOUT generated by the phase lock loop 10 varies periodically. As an example, frequency of the output clock SOUT generated by the phase lock loop 10 varies between f1 and f2, in a triangular wave, as shown in FIG. 2B.

When the phase of one input clock leads that of the other input clock of a phase lock loop, the phase/frequency detector outputs a pump-up signal to control the charge pump, increasing the frequency of the output clock thereof. On the contrary, when the phase of the input clock lags behind that of the other input clock, the phase/frequency detector outputs a pump-down signal to control the charge pump, decreasing the frequency of the output clock of the PLL.

Figure 2C:
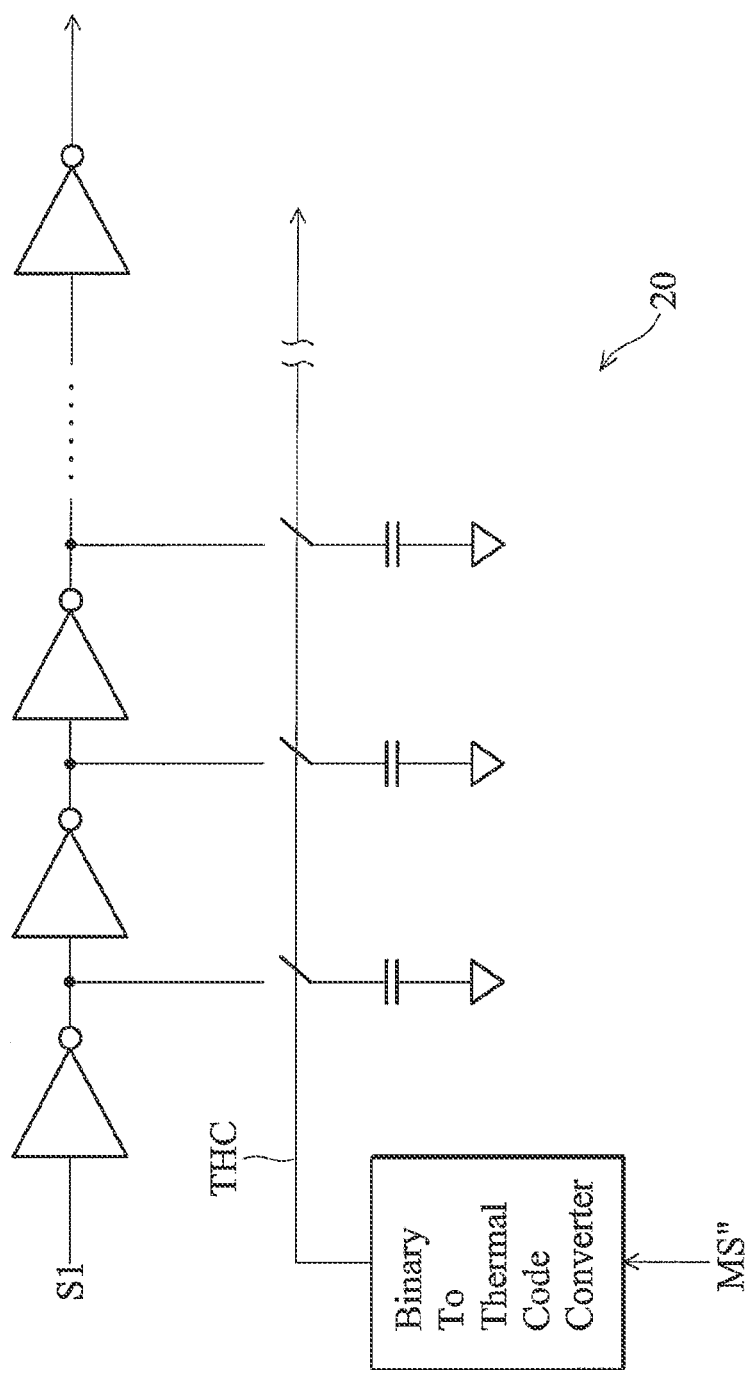
FIG. 2C shows a wave diagram of the spread spectrum clock generator shown in FIG. 2A.

In this embodiment, the delay unit 20 comprises a binary to thermal code converter, a plurality of inverters connected in series, a plurality of switching elements coupled to the inverters, and a plurality of capacitors each coupled between a corresponding switching element and ground, as shown in FIG. 2C. The binary to thermal code converter converts the scaled modulation signal MS" to a control (thermal) code THC to switch the switching elements, changing the phase of the first input clock S1. Namely, a phase variation between the modulated first input clock and the original first input clock S1 provided by the crystal oscillator 70 depends on the scaled modulation signal MS" shown in FIG. 2B.

In the initial state, the switching elements can, for example, be all turned on and the first and second input clocks S1 and S2 have the same phase. Once one or more of the switching elements is turned off, the phase of the first input clock S1 abruptly leads the second input clock S2 because the number of charged capacitors is decreased. Hence, the frequency of the output clock SOUT is increased accordingly. Further, if the accumulated phase difference, which the first input clocks S1 leads the second input clock S2, exceeds half period of the second input clock S2, it can be regarded as the second input clock S2 leads the first input clock S1 and thus, the frequency of the output clock SOUT is decreased accordingly.

For example, the switching elements in the delay line 20 of the embodiment can be turned off by parts according to the scaled modulation signal MS" until all are turned off or the accumulated delay time reaches a predetermined level. Hence, the frequency of the output clock SOUT is increased as the switching elements are turned off progressively until the accumulated phase difference exceeds half period of the second input clock S2 at time t1 and is then decreased after time t1 until all switching elements are turned off at time t2. Similarly, the frequency of the output clock SOUT is increased at time t2 and is then decreased after time t3 until time t4, and so on.

Due to limitation of physical elements, it is impossible to utilize a delay line with infinite length in practice. Thus, the embodiment skips cycles of the output clock SOUT by the frequency divider 60 and resets the delay line 20 when the delay line 20 is not able to delay the first input clock S1 anymore. In this embodiment, the frequency divider 60 has a first operating mode dividing the second input clock S2 by a division factor of 30 and a second operating mode dividing the second input clock S2 by a division factor of 29, and the operating modes are switched according to the modulation signal MS.

For example, when the modulation signal MS reaches the threshold value TH, the quantizer 38 outputs the value SQ of "1" to the scaling unit 36 and the frequency divider 60, such that the scaling unit 36 outputs the scaled value to reset the modulation signal MS (by the subtractor 33) meanwhile the frequency divider 60 is enabled to enter the second operating mode from the first operating mode. Hence, the output clock SOUT from the phase lock loop 10 is divided by the division factor of 29 at time t2 and one period (1T) of the output clock SOUT is skipped.

If the default delay period of the delay line 20 is assumed to be one period (1T) of the output clock SOUT, the output clock SOUT is skipped by one period, such that the timing of the first and second input clocks S1 and S2 can match. It should be noted that the number of cycles skipped is related to division factors. For example, when the default delay period of the delay line 20 is assumed as two periods (2T) of the output clock SOUT, the output clock SOUT can be divided by the division factor of 28 from the division factor of 30, two periods (2T) of the output clock SOUT are skipped, and so on.

The calibration unit 50 adjusts a scale ratio of the scaling unit 40 in order to match the real delay period of the delay line 20 to the skipped cycle. For example, if the real delay period is less than the default, the calibration unit 50 increases the scale ratio of the scaling unit 40. On the contrary, if the real delay period exceeds the default, the calibration unit 50 lowers the scale ratio of the scaling unit 40. Namely, the calibration unit 50 adjusts the scale ratio of the scaling unit 40 such that the real delay period and default delay period of the delay line 20 are matched to the skipped cycles.

Figure 3A:
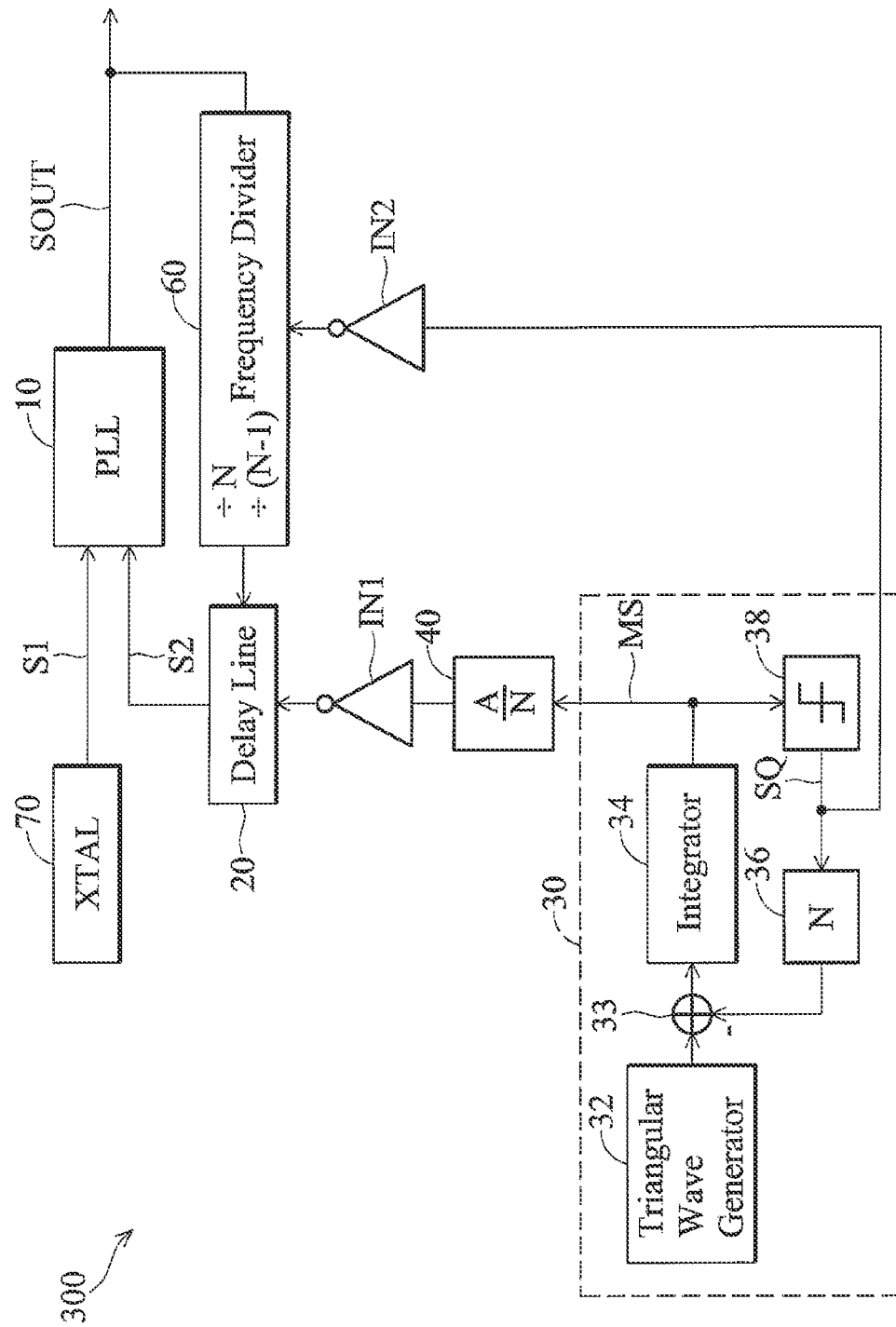
FIG. 3A shows another embodiment of a spread spectrum clock generator.
Figure 3B:
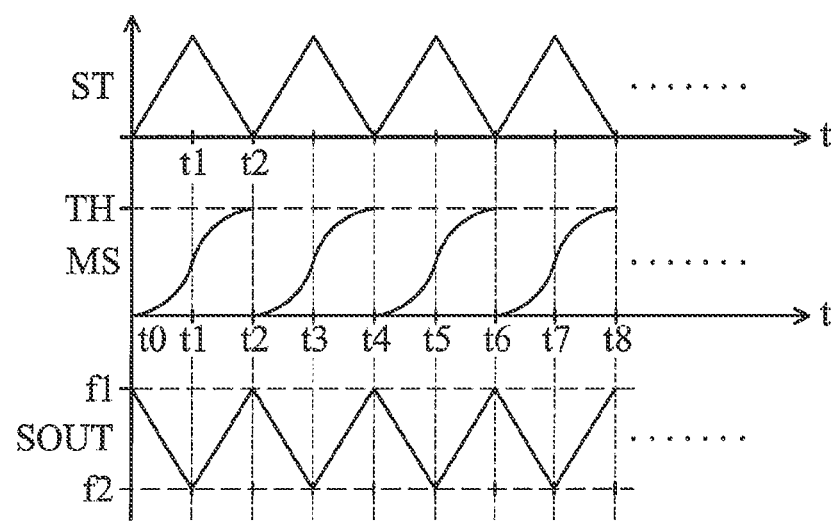
FIG. 3B is a wave diagram of the spread spectrum clock generator shown in FIG. 3A.

FIG. 3A shows another embodiment of a spread spectrum clock generator 300 differing from the spread spectrum clock generator 200 shown in FIG. 2A only in that the delay line 20 is coupled between the phase lock loop 10 and the frequency divider 60 to modulate the second input clock S2 and two inverters INV1 and INV2 coupled between the delay line 20 and the modulation unit 30 and between the frequency divider 60 and the modulation unit 30. Similar structure and operations between the embodiments are omitted for simplification. It should be noted that the output clock SOUT of the phase lock loop 10 in the spread spectrum clock generator 300 is shown in FIG. 3B and is inverse to that of the spread spectrum clock generator 200.

Figure 4:
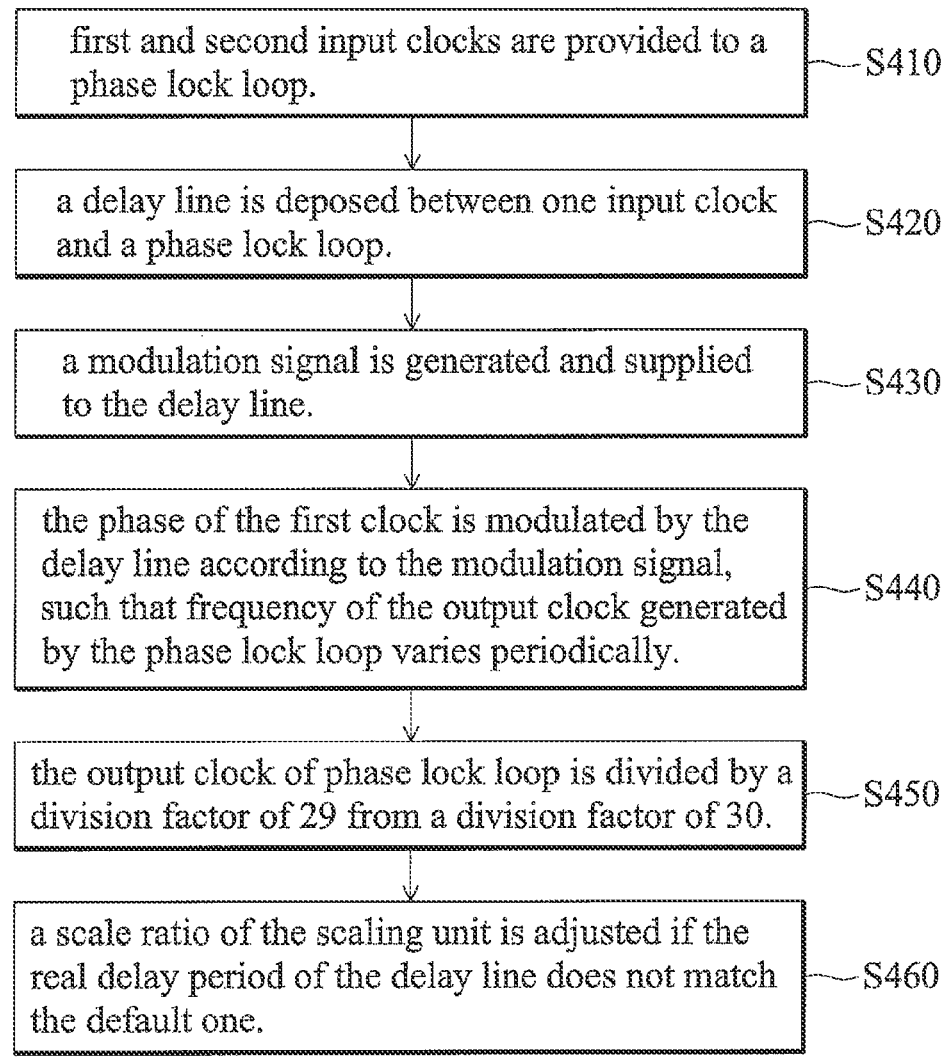
FIG. 4 is a flowchart of a method for generating spread spectrum clock signals.

FIG. 4 shows a flowchart of a method for generating spread spectrum clock signals. In step S410, first and second input clocks are provided to a phase lock loop. For example, the first input clock S1 is provided by a crystal oscillator 70 and the second input clock S2 can be provided by the frequency divider 60 as shown in FIGS. 2A and 3A. In this embodiment, the frequency divider 60 has a first operating mode dividing the second input clock S2 by a division factor of 30 and a second operating mode dividing the second input clock S2 by a division factor of 29.

In step S420, a delay line is disposed between one input clock and a phase lock loop. For example, the delay line 20 can be coupled to the phase lock loop 10 to modulate the first input clock S1 provided by a crystal oscillator 70 as shown in FIG. 2A or the second input clock S2 provided by frequency divider 60 as shown in FIG. 3A. For example, the delay line 20 can comprises a binary to thermal code converter, a plurality of inverters connected in series, a plurality of switching elements coupled to the inverters, and a plurality of capacitors each coupled between a corresponding switching element and ground, as shown in FIG. 2C.

In step S430, a modulation signal is generated and supplied to the delay line. For example, the modulation signal MS can be generated by the modulation unit 30 and supplied to the delay line 20. In the modulation unit 30, a triangular wave signal ST is generated by a triangular wave generator 32 and supplied to an integrator 34, and the integrated triangular signal serves as the modulation signal MS. The modulation signal MS is supplied to the scaling unit 40 and the scaled modulation signal MS" is supplied to the delay line 20. In some embodiments, the modulation signal MS can be directly supplied to the delay line 20 without scaling by the scaling unit 40.

Further, the modulation signal MS is also supplied to the quantizer 38 which outputs a value SQ to the scaling unit 36 and the frequency divider 60 according to the received modulation signal MS. For example, when the modulation signal MS reaches a threshold value TH, the quantizer 38 generates a value SQ of "1", the value SQ of 1 is scaled by the scaling unit 36 and outputs it to the subtractor 33. Hence, the subtractor 33 subtracts the scaled value from the modulation signal MS of the integrator 34, such that the modulation signal MS is reset and becomes zero accordingly. As shown in FIG. 2B, the modulation signal MS is reset by the scaled value output from the scaling unit 36 at time t2, t4, t6 and t8 and so on.

Moreover, when the modulation signal MS is reset (becomes zero) and below the threshold value TH, the quantizer 38 generates a value SQ of "0" until the modulation signal reaches the threshold value TH again. Hence, the triangular wave signal ST from the triangular wave generator 32 would be integrated to the threshold value TH from zero again and again as shown in FIG. 2B to serve as the modulation signal MS. Namely, the subtractor 33, the integrator 34, quantizer 38 and the scaling unit 36 are connected to form a feedback loop, such that the triangular wave signal ST is integrated as the modulation signal MS as shown in FIG. 2B.

In step S440, the phase of the first clock is modulated by the delay line according to the modulation signal, such that frequency of the output clock generated by the phase lock loop varies periodically. The delay line 20 modulates the phase of the first clock S1 according to the scaled modulation signal MS" from the scaling unit 40, but is not limited thereto. In some embodiments, the delay line 20 can also modulate the phase of the first clock S1 according to the modulation signal MS from the integrator 34 without scaling by the scaling unit 40.

For example, the binary to thermal code converter in FIG. 2C can convert the scaled modulation signal MS" to a control (thermal) code THC to switch the switching elements, changing the phase of the first input clock S1. The switching elements can be all turned on and the first and second input clocks S1 and S2 have the same phase in the initial state. When one or more of the switching elements is turned off, the phase of the first input clock S1 abruptly leads the second input clock S2 because the charged capacitors are decreased. Hence, the frequency of the output clock SOUT is increased accordingly. Further, as the accumulated phase difference, with which the first input clocks S1 leads the second input clock S2, exceeds half period of the second input clock S2, it can be regarded as the second input clock S2 leads the first input clock S1 and thus, the frequency of the output clock SOUT is decreased accordingly.

In this embodiment, the switching elements in the delay line 20 can be turned off by parts according to the scaled modulation signal MS" until all are turned off. Hence, the frequency of the output clock SOUT is increased as the switching elements are turned off progressively until the accumulated phase difference exceeds half period of the second input clock S2 at time t1 and is then decreased after time t1 until all switching elements are turned off at time t2. Namely, the frequency of the output clock SOUT of the phase lock loop 10 can be varied between f1 and f2 as a triangular wave as shown in FIGS. 2C and 3B.

In step S450, the output clock of phase lock loop is divided by a division factor of 29 from a division factor of 30. Due to limitations in physical elements, it is impossible to utilize a delay line with infinite length in practice. Thus, the embodiment skips cycles of the output clock SOUT by the frequency divider 60 and resets the delay line 20 when the delay line 20 is not able to delay the first input clock S1 anymore.

For example, when the modulation signal MS reaches the threshold value TH, the quantizer 38 outputs the value SQ of "1" to the scaling unit 36 and the frequency divider 60. Accordingly, the scaled value output from the scaling unit 36 resets the modulation signal MS by the subtractor 33 and enables the frequency divider 60 to enter the second operating mode from the first operating mode. Hence, the output clock SOUT from the phase lock loop 10 is divided by the division factor of 29 at time t2 such that one period (1T) of the output clock SOUT is skipped.

If the default delay period of the delay line 20 is assumed to be a period of the output clock SOUT, the output clock SOUT is skipped by one period (1T), such that the timing the first and second input clocks S1 and S2 can match.

In step S460, a scale ratio of the scaling unit 40 is adjusted if the real delay period of the delay line 20 does not match the default. For example, if real delay period is less than the default, the calibration unit 50 increases the scale ratio of the scaling unit 40. On the contrary, if real delay period exceeds the default, the calibration unit 50 lowers the scale ratio of the scaling unit 40.

It should be noted that the number of cycles skipped is related to the division factors. For example, when the default delay period of the delay line 20 is assumed as two periods (2T) of the output clock SOUT, the output clock SOUT can be divided by the division factor of 28 from the division factor of 30, two periods (2T) of the output clock SOUT are skipped, and so on. In this case, the calibration unit 50 adjusts the scale ratio of the scaling unit 40 such that the real delay period of the delay line 20 is 2T.

In the invention, the phase of the input clock S1 is modulated by the modulation signal, such that the frequency of the output clock SOUT is varied periodically (between f1 and f2) as shown in FIGS. 2B and 3B. Namely, the spread spectrum clock generator 200 and 300 can generate spread clock signals by modulating the phase of the phase lock loop. Further, the invention skips cycles of the output clock by the frequency divider when the delay line no longer delays the input clock, and thus, only a delay line with a predetermined delay period is required while one with infinite length is not required.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A spread spectrum clock generator, comprising:
    a phase locked loop generating an output clock according to a first clock and a second clock;
    a delay line coupled between the first clock and the phase locked loop;
    a modulation unit providing a modulation signal to control the delay line thereby modulating phase of the first clock, such that frequency of the output clock generated by the phase locked loop varies periodically;
    a scaling unit scaling the modulation signal from the modulation unit according to a scaling ratio, and outputting to the delay line; and
    a calibration unit generating an output signal for controlling the scaling ratio;
    wherein the output clock is divided by a division factor when the modulation signal exceeds a threshold value.

2. The spread spectrum clock generator as claimed in claim 1, wherein the first clock is provided by an oscillator, and the second clock is provided by a frequency divider according to the output clock of the phase locked loop.

3. The spread spectrum clock generator as claimed in claim 1, wherein the first clock is provided by a frequency divider according to the output clock of the phase locked loop, and the second clock is provided by an oscillator.

4. The spread spectrum clock generator as claimed in claim 1, wherein the modulation unit comprises:
    a triangular wave generator generating a triangular wave signal; and
    an integrator integrating the triangular wave signal to generate the modulation signal.

5. The spread spectrum clock generator as claimed in claim 4, wherein the modulation unit further comprises a quantizer triggering a frequency divider to divide the output clock from the phase locked loop by a division factor of Y when the modulation signal exceeds a threshold value.

6. A spread spectrum clock generator, comprising:
    a phase locked loop generating an output clock according to a first clock and a second clock;
    a delay line coupled between the first clock and the phase locked loop;
    a modulation unit coupled to the delay line;
    a scaling unit coupled between the delay line and the modulation unit to scale a modulation signal from the modulation unit and outputting to the delay line; and
    a calibration unit coupled to the scaling unit, the calibration unit generating an output signal for controlling a scaling ratio;
    wherein the output clock is divided by a division factor according to the modulation signal.

7. The spread spectrum clock generator as claimed in claim 6, wherein the modulation unit comprises:
    a triangular wave generator generating a triangular wave signal; and
    an integrator coupled between the triangular wave generator and the delay line.

8. The spread spectrum clock generator as claimed in claim 6, wherein the first clock is provided by an oscillator.

9. The spread spectrum clock generator as claimed in claim 6, wherein the first clock is provided by a frequency divider according to the output clock of the phase locked loop.

10. A method for generating spread spectrum clock signals, comprising:
    providing a modulation signal;
    scaling the modulation signal based on a scaling ratio controlled by a calibration unit; and
    modulating phase of a first clock of a phase locked loop according to the scaled modulation signal, such that frequency of an output clock generated by the phase locked loop varies periodically;
    dividing the output clock by division factors of X or Y according to the modulation signal, wherein X and Y are integers and X>Y,
    wherein the phase of the first clock is modulated by a delay line according to the scaled modulation signal.

11. The method as claimed in claim 10, wherein providing the modulation signal comprising:
    providing a triangular wave signal; and
    integrating the triangular wave signal to generate the modulation signal.

12. The method as claimed in claim 10, further comprising triggering a frequency divider to divide the output clock from the phase locked loop by a division factor of Y when the modulation signal exceeds a threshold value.

13. The method as claimed in claim 10, further comprising:
    dividing an output clock of the phase locked loop to generate the first clock by a frequency divider, in which the frequency divider divides the output clock by division factors of X or Y according to the modulation signal, wherein X and Y are integers and X>Y.

14. The method as claimed in claim 10, further comprising:
    providing the first clock to the phase locked loop by an oscillator.

* * * * *